United States Patent
Baclez et al.

(10) Patent No.: US 6,248,440 B1
(45) Date of Patent: Jun. 19, 2001

(54) METHOD FOR OBTAINING A FLOOR COVERING AND PRODUCT OBTAINED

(75) Inventors: Emmanuelle Baclez, Lille; Brigitte Mutel, Leers; Odile Dessaux; Pierre Goudmand, both of Lille, all of (FR)

(73) Assignee: Sommer Revetements France S. A., Nanterre Cedex (FR)

( * ) Notice: Subject to any disclaimer, the term of this patent is extended or adjusted under 35 U.S.C. 154(b) by 0 days.

(21) Appl. No.: 09/043,351

(22) PCT Filed: Sep. 2, 1996

(86) PCT No.: PCT/EP96/03859

§ 371 Date: Mar. 13, 2000

§ 102(e) Date: Mar. 13, 2000

(87) PCT Pub. No.: WO97/10287

PCT Pub. Date: Mar. 20, 1997

(30) Foreign Application Priority Data

Sep. 15, 1995 (EP) .................................................. 95870103

(51) Int. Cl.$^7$ ................................ C08J 7/06; C23C 16/44
(52) U.S. Cl. .......................... 428/336; 427/574; 427/575; 427/578; 427/579; 428/451
(58) Field of Search ................................... 427/574, 575, 427/578, 579; 428/336, 451

(56) References Cited

U.S. PATENT DOCUMENTS 5,077,112   12/1991   Hensel et al. ......................... 428/76
5,188,876   2/1993   Hensel et al. ......................... 428/76
5,508,368   4/1996   Knapp et al. ......................... 427/534

FOREIGN PATENT DOCUMENTS

| 107 312 | 7/1994 | (DD) . |
| 0 590 467 A1 | 9/1993 | (EP) . |
| WO 94/183455 | 8/1994 | (WO) . |
| WO 95/19456 | 7/1995 | (WO) . |
| WO 95/23652 | 9/1995 | (WO) . |

*Primary Examiner*—D. S. Nakarani
(74) *Attorney, Agent, or Firm*—Alix, Yale & Ristas, LLP

(57) ABSTRACT

A method for obtaining a floor covering comprising one or more resilient polymer substrates coated with a protective layer is described, wherein said layer contains one or more amorphous inorganic components and has a Vickers hardness of more than 1 GPa and a modulus of elasticity (Young's modulus) of less than 80 GPa, using a delayed cold plasma that induces a decomposition reaction of a volatile precursor compound so that a thin film of said amorphous inorganic component is formed on said substrate. A floor covering comprising one or more resilient polymer substrates obtained by the method of the invention is also described, wherein the substrate is coated with a protective layer containing one or more amorphous inorganic components and with a Vickers harness of more than 1 GPa and a modulus of elasticity (Young's modulus) of less than 80 GPa.

21 Claims, 9 Drawing Sheets

METHOD FOR OBTAINING A FLOOR COVERING AND PRODUCT OBTAINED

CROSS-REFERENCE TO RELATED APPLICATIONS

This is the national stage of International Application No. PCT/EP96/03859 filed Sep. 2, 1996.

SUBJECT OF THE INVENTION

The present invention relates to a process for obtaining a floor covering comprising at least one substrate consisting of a polymeric material.

The present invention also relates to the floor covering obtained by this process.

TECHNOLOGICAL BACKGROUND

Vinyl-type floor coverings have been known for a long time. Their composition is essentially based on vinyl chloride homopolymers or copolymers commonly called PVC.

Furthermore, products intended as floor coverings essentially produced from an acrylic resin or from olefin homopolymers or copolymers have recently appeared on the market for the purpose of replacing these PVC-type coverings, especially for environmental protection reasons.

These polymeric coverings, intended for covering floors, are called by those skilled in the art "resilient" polymeric coverings as opposed to coverings such as those made of ceramic and wood, which are not resilient.

Among polymeric coverings are the thermoplastic polymeric coverings mentioned above, but also certain thermosetting polymeric coverings comprising melamine resins used for producing floor coverings.

These floor coverings, whatever their nature, are intrinsically subjected to a great deal of traffic and consequently deteriorate quite quickly through wear.

In fact, this deterioration is essentially due to the scratchability of the covering by the rubbing of hard particles.

Various processes have consequently been proposed for improving the resistance of floor coverings by increasing the hardness of their surface, essentially by depositing a protective layer.

Most of the protective layers, more generally called "top coats", currently used are of the organic type and, in particular, are based on polyurethanes generally containing aliphatic polyisocyanates.

Such coverings may be applied using solutions, in organic phase, of one-part or two-part systems, of aqueous dispersions or of reactive systems having a solids content of 100%.

It may be mentioned that the solution systems are crosslinked by hydroxylated polyesters or polyethers, of which many types exist. Hydroxylated acrylic polymers are also used as a diisocyanate crosslinking agent. The crosslinking takes place in an oven and requires a catalyst.

As regards the polyurethane systems in aqueous phase, these are crosslinked by melamine resins or aziridines in an oven.

The solvent-free systems are intended to be dried under UV radiation. These are polyurethanes obtained from diisocyanates, from hydroxylated polyethers or polyesters and from hydroxylated acrylic monomers. They may be diluted with reactive polyacrylated monomers in order to adjust the application viscosity. Drying is extremely rapid, but does require the addition of photoinitiators.

Other systems have been used, such as:

hydrolysed alkyl silicate or organoalkoxy-silane+ polyurethane elastomers, alkyd resin+polymethoxybutoxytrimethyl-siloxysilane+ butoxylated melamine resin, ethoxylated melamine resin+epoxy resin+styrene-allyl alcohol copolymer, etc.

It should be noted that, in the literature, these top coats are always applied to vinyl-type floor coverings, that is to say those based essentially on PVC.

On the other hand, in the case of floor coverings based on other polymers, such as EVA (ethylene-vinyl acetate) copolymers, no specific mention of a protective layer has been made in the literature.

Nevertheless, the various techniques proposed come up against certain difficulties, the main ones of which are the scratchability and the loss of appearance, in particular the degree of gloss and of transparency, which defects are related to traffic. In addition, the adhesion of the protective layer to the substrate, which, in the case of a floor covering, is a resilient polymeric substrate, and the mechanical stability, between the deposit of organic material making up the protective or wear layer and the substrate itself, are often insufficient.

STATE OF THE ART

Documents U.S. Pat. Nos. 5,188,876 and 5,077,112 describe surface coverings, and in particular floor coverings, comprising several layers, at least one of which is a wear layer made of a hard inorganic material deposited on a support using techniques working under reduced-pressure conditions.

Among these techniques may be mentioned ion bombardment, plasma polymerization, ion implantation and ion plasma.

The support may be chosen from the following materials: metal, plastic film or sheet, rubber or support comprising a mineral. Among the plastics are mentioned thermoplastics and thermosets. By way of example, mention may be made of polyethylene terephthalate and polyesters, optionally reinforced. PVC is also mentioned.

With regard to the wear layer, this is produced from a hard inorganic material comprising metals, metal oxides or metal nitrides, and having a hardness of at least 5 mohs. By way of examples, silicone oxides and nitrides are most particularly mentioned.

The thickness of this layer is between 1 and 25 microns.

The techniques mentioned, of the ion- or thermal-plasma type, heat the support significantly and cause it to deteriorate. In addition, it is difficult to achieve satisfactory operating conditions in large volumes, except by multiplying the number of sources.

In these two American documents, it is also mentioned that the surface layer is polycrystalline.

Document WO-A-95/19456 describes a general process for depositing a metal, semi-metal, metal oxide or semi-metal oxide layer on a substrate using the nitrogen remote cold plasma technique, it being possible for the substrate to be a metal, an alloy, a ceramic, a polymer, composite materials or even glass. By way of example, a polypropylene substrate is mentioned.

In order to carry out this process, a volatile alkyl derivative of the said metal or semi-metal is introduced into a closed chamber, so as to decompose the said alkyl and to deposit the metal, semi-metal, metal oxide or semi-metal oxide layer on the substrate.

Document WO-A-95/23652 describes a process for depositing an abrasion-resistant coating comprising one or more layers on a substrate using an ion beam.

The material intended to produce the coating must be optically transparent and consist of silicon carbide, silicon nitride, silicon oxide, silicon oxynitride, silicon oxycarbide, silicon carbonitride or silicon oxycarbonitride.

The substrate on which the coating is deposited may be a plastic, a metal, glass or ceramic, and is intended for particular applications such as ophthalmic lenses, plastic lenses, bar code-scanner windows or windows for other elements which may rapidly deteriorate. It should be noted that the substrate is not a resilient material.

Document DD-A-107312 describes a process for covering a plastic surface, such as PVC and polyethylene with a "non-slip" layer made of a ceramic or metallic material, by means of a thermal spray device such as plasma gun.

Document EP-A-0,590,467 describes a process for depositing a silicon-oxide-based layer on synthetic materials such as polymethyl methacrylate or poly-carbonate, by a plasma treatment using an organosilane or organosiloxane compound in gaseous form.

Document WO-A-94/18355 describes a process for applying a thin layer on a metallic, inorganic or organic substrate using a nitrogen-based remote cold plasma for the purpose of fabricating electronic or microelectronic devices. More particularly, this process is intended for forming dielectric thin layers in which organometallic compounds are involved.

OBJECTS OF THE INVENTION

The aim of the present invention is to provide a process for obtaining a floor covering which consists of a resilient polymeric substrate, that is to say one which deforms under impact, and which has a transparent protective layer having improved wear resistance properties compared to those of the floor coverings proposed by various processes in the state of the art.

In particular, the present invention aims to provide a production process which makes it possible to obtain good adhesion of the coating serving as the protective layer to the substrate without having to use a "multilayer" process.

The present invention also aims to provide a process which is a "clean process", which can be carried out at ambient temperature and without the substrate being heated to temperatures risking damaging it.

Furthermore, the present invention aims to provide a process which makes it possible to treat large areas and therefore which allows the process to be implemented on an industrial scale, under acceptable technical conditions, in particular vacuum and temperature conditions.

The particular technical problem which arises when it is desired to deposit a hard protective layer on a flexible support made of a polymeric material of the type used as floor coverings is the fact that, on the one hand, it is necessary to avoid damaging the substrate during the treatment and that, on the other hand, the hard protective layer must also not be too rigid. In fact, this protective layer must be sufficiently flexible or elastic for the floor covering product to be able to be rolled up, laid and used in the conventional manner for floor coverings currently on the market.

An additional constraint to which the documents U.S. Pat. Nos. 5,077,112 and 5,188,876 moreover allude is the fact that the protective layer must have good substrate-adhesion characteristics.

The probability of obtaining a protective layer which is both hard and adherent to the resilient substrate is therefore very low. In addition, the operating conditions must be such that the nature of the support must not be altered during the treatment.

MAIN CHARACTERISTIC ELEMENTS OF THE PRESENT INVENTION

The present invention relates to a process for obtaining a floor covering comprising at least one resilient polymeric substrate on which a protective layer is deposited, this layer consisting of at least one amorphous inorganic component having a Vickers hardness of greater than 1 Gpa and a modulus of elasticity (Young's modulus) of less than 80 GPa, using a remote cold plasma which induces a decomposition reaction in a volatile precursor compound, allowing the formation of a thin film of the said amorphous inorganic component on the said substrate.

Preferably, the protective layer is deposited with a thickness of less than 10 $\mu$m, and more particularly of between 1 and 5 $\mu$m.

It is surprising that the floor covering comprising, on the one hand, a resilient polymeric substrate and, on the other hand, a protective layer of a hard inorganic substance is satisfactory with regard to, on the one hand, the properties specific to floor coverings, such as penetration and good response both to deformability and to mechanical stresses associated with traffic, and, on the other hand, the properties specific to the protective layer, such as wear resistance and scratch resistance. A compromise has therefore been made between properties which could in principle seem contradictory.

Surprisingly, it has also been observed that the adhesion properties of the hard protective layer to the resilient substrate are quite satisfactory.

Preferably, the remote cold plasma used will be a nitrogen-based plasma induced by a microwave-type or radiofrequency-type discharge.

The frequency used to create the plasma is preferably 2450 MHz or 13.56 MHz.

According to one embodiment, it is preferred to work in the remote cold plasma afterglow region, in particular in the "far" afterglow region, i.e. in the afterglow region free of ionic species. The far nitrogen-based afterglow region offers several advantages, such as the possibility of working with a large volume, this being particularly important when treating a floor covering, and the possibility of working at temperatures close to ambient temperature, namely a temperature not exceeding 325 K, thus avoiding any deterioration of the polymeric substrate.

The floor covering obtained comprises at least one resilient polymeric substrate consisting of PVC, acrylic resins or an olefin homopolymer or copolymer, but also consisting of melamine-based resins.

The protective layer which it is desired to obtain for the purpose of covering the resilient polymeric substrate consists of an inorganic component, having a hardness greater than that of the material of which the polymeric substrate is composed, and preferably of between 1 and 10 GPa (measured using the Vickers method), while the usual polymeric substrates have a hardness of between 10 and 100 MPa.

The protective layer preferably consists of a transparent film of an inorganic component, the modulus of elasticity of which is between 20 and 50 GPa.

It is particularly advantageous to choose, from these various components, silicon nitride, which is known for its high hardness. Using the remote cold plasma technique, a combined effect of hardness and elasticity properties of the protective layer is surprisingly obtained.

Depending on the nature of the protective layer obtained, a suitable precursor is used. In particular when producing a protective layer in the form of a silicon oxide or a silicon nitride, this being the most suitable choice from the current state of knowledge in order to achieve the indicated parameter values, a silicon precursor is used which is preferably a silane, such as $SiH_4$, or another silicon derivative, in particular $SiCl_4$, $SiF_4$, $SiH_2Cl_2$, $SiHCl_2$, $Si_2H_6$, $Si_3H_8$, $CH_3$—$CH_2$—$SiH_2Cl$, $CH_3$—$CH_2$—$SiHCl_2$, $[N(CH_3)_2]_3SiH$,$[N(CH_3)_2]_4Si$, etc.

The precursor is introduced into the far afterglow region, preferably colinearly with the plasmagenic gas.

According to a preferred embodiment of the invention, a remote cold plasma pretreatment is also carried out for the purpose of increasing the surface energy of the polymers of which the resilient substrate is composed, and therefore to increase their capability of adhesion without altering their properties, this also being preferably carried out in the far afterglow region.

According to another preferred embodiment, a plasma post-treatment is carried out for the purpose of eliminating the residual traces of precursor. This is preferably performed using a nitrogen-based remote cold plasma after depositing the protective layer.

Usually, the working pressures are between 1 and 20 hPa and the temperatures are close to ambient temperature. This allows the technique to be transposed for implementation on an industrial scale, given in particular the less demanding vacuum conditions.

The device for implementing the process according to the present invention includes at least one sealed reaction chamber, connected in a sealed manner to at least two injection ports, at least one of which is provided with a means for forming a remote cold plasma and the other of which serves to bring the precursor in volatile form into the reaction chamber. Furthermore, the chamber is provided with an outlet port connected to a continuous pumping system.

DETAILED DESCRIPTION OF A PREFERRED EMBODIMENT OF THE PRESENT INVENTION

The present invention will be described in more detail with reference to a device within the scope of the implementation of a process using a nitrogen-based remote cold plasma, in which process the volatile compound serving as precursor is silane, for the purpose of dissociating the precursor by the action of the plasma, making it possible to deposit a thin film, in particular of silicon nitride, on the polymeric substrate of the floor covering.

Such a film may be formed on any resilient polymeric substrate, and in particular on a PVC substrate.

Moreover, it may be hoped, by carefully choosing the suitable precursor, to deposit, using the same technique, thin films of hard inorganic substances such as those shown in Table 1, in which these substances are classed in order of increasing hardness.

Figure 1:
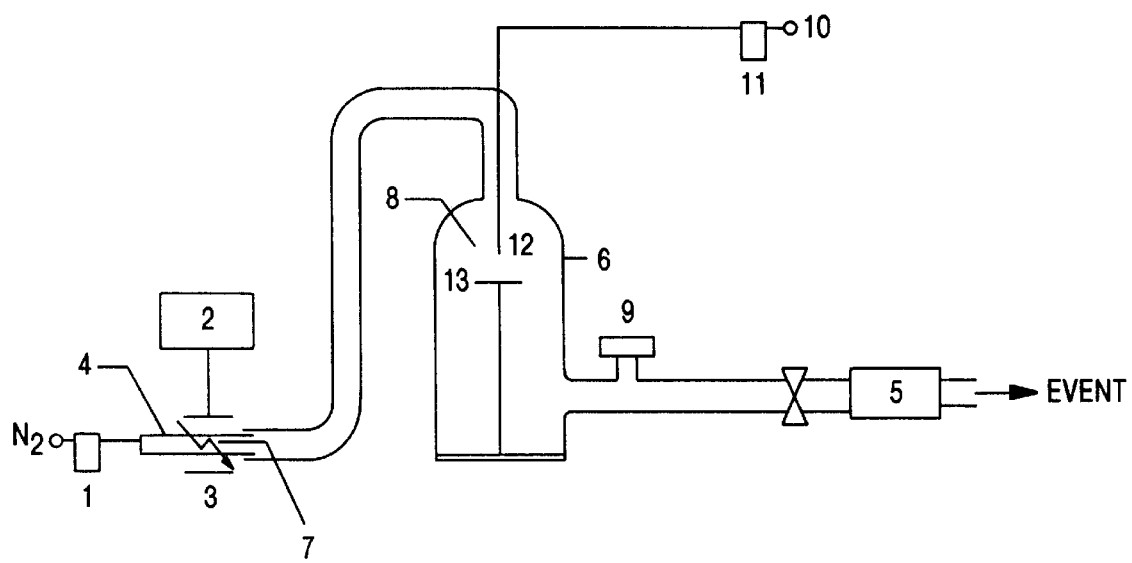
FIG. 1 shows a diagrammatic view of the device intended for implementing the process as described in the above embodiment.

FIG. 1 shows the experimental device used for creating a nitrogen-based remote cold plasma (NRCP). A flow of molecular nitrogen, controlled by a mass flow meter 1, is excited by means of an electrodeless electrical discharge by means of a microwave generator 2 connected to a resonant cavity 3. In the present case, a generator operating at a frequency of 2450 MHz is used. The discharge is produced in a tube 4 having an internal diameter of 22 mm. By continuous pumping, using a roughing vacuum pump 5, the plasma is transferred into the reaction chamber 6 lying approximately 1.10 m from the discharge. The discharge plasma 7 which, corresponds to the region where the electric field acts, is characterized by a high concentration of ionic species. The nitrogen-based remote cold plasma (NRCP) obtained in the reaction chamber 8 is characterized by non-ionic active species corresponding to a far afterglow region. A pressure sensor or Pirani gauge 9 at the exit of the reactor is used to measure the initial vacuum (of about $10^{-2}$ hPa) and the working pressure, which is between 1 and 20 hPa and preferably between 1 and 5 hPa.

The reactive gas used as precursor 10 in the embodiment described is a volatile silane compound. This gas is introduced by means of a gas-regulating mass flow meter and a tubular injector 12 colinearly with the flow of plasmagenic gas in the far afterglow region 8. It is conceivable to use an injector having one or more injection orifices allowing uniform and homogeneous deposition on large-sized substrates to be achieved.

The specimens on which the deposition is carried out are placed on a specimen holder 13 whose distance from the injector can be varied. By varying the rotation and/or displacement of the specimen holder, it is also possible to produce a uniform deposit on the said specimen.

According to a preferred embodiment, the deposition procedure is carried out in three steps:

the first step consists in treating samples of a floor covering comprising a resilient polymeric substrate with a nitrogen remote cold plasma (NRCP) for the purpose of enhancing the adhesive properties of the surface of the polymer by grafting new chemical functional groups, this first step being carried out in the far afterglow region; this first step in the far afterglow region lasts for a few minutes;

the second step consists in carrying out the deposition, which takes place directly after the pretreatment step and without venting to atmosphere, by injecting the reactive precursor gas (preferably silane) into the nitrogen-based remote cold plasma, still in the far afterglow region. The deposition region may be easily modified by varying the ratio of the partial pressures of the plasmagenic gas and the precursor;

the final step, which is the post-deposition step, consists in again exposing the substrate to a nitrogen remote cold plasma for a few minutes for the purpose of eliminating any trace of precursor in the reaction chamber.

By carrying out the process as described above, and more particularly by carrying out the various steps mentioned above, a layer of an amorphous inorganic component will be deposited which, surprisingly, has a relatively high hardness, i.e. greater than 1 GPa for a modulus of elasticity of less than 80 GPa.

It is probably the particular nature of the technique used to deposit the inorganic component which gives this surprising combination of opposing characteristics, such as hardness and elasticity.

In the particular case of a silicon nitride protective layer, an amorphous silicon nitride may be distinguished from a crystalline silicon nitride either by analyzing the infrared spectrum or by analysing the Raman spectrum.

Figure 2:
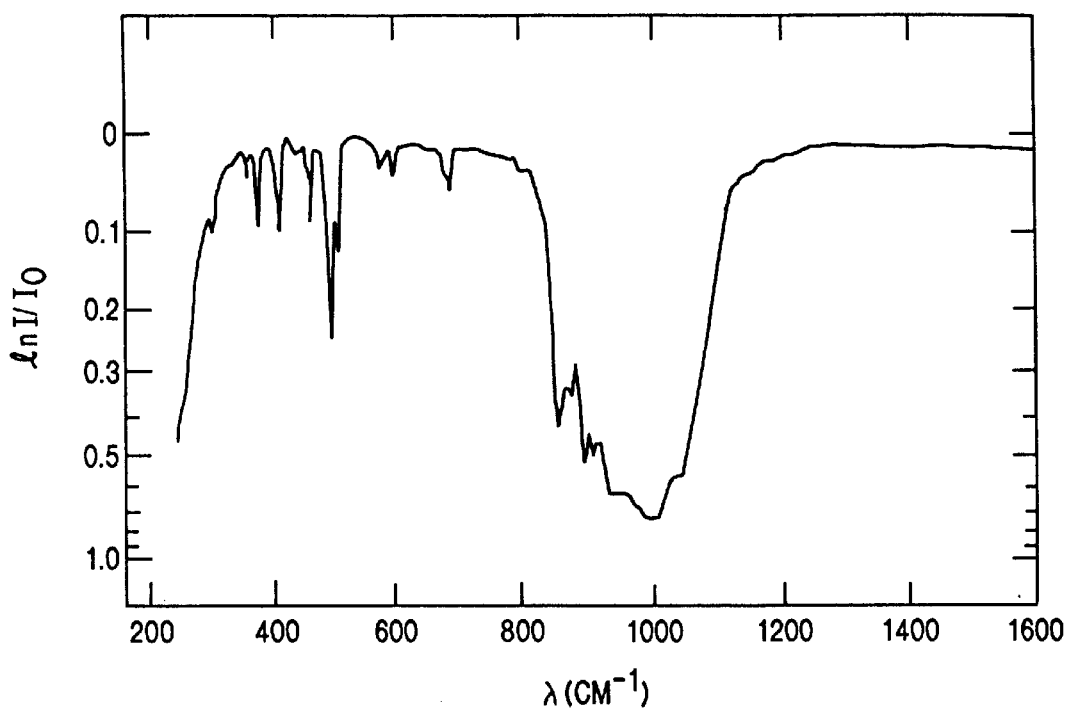
FIGS. 2, 3, 4 and 5 show infrared spectra for various varieties of silicon nitride.
Figure 3:
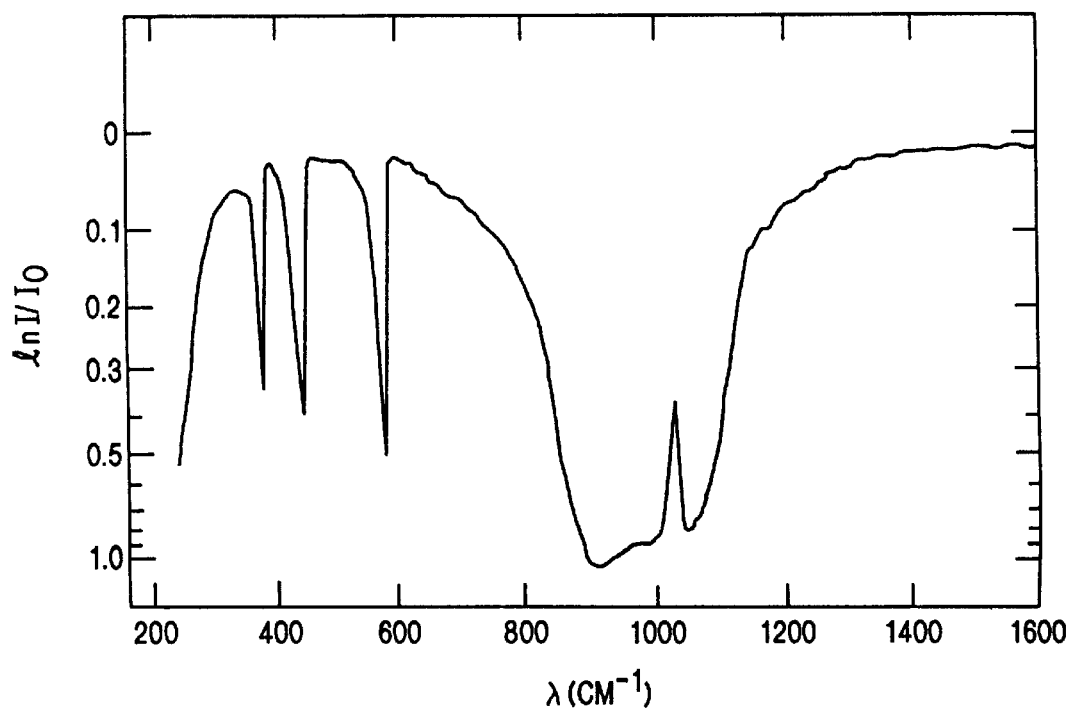
Figure 4:
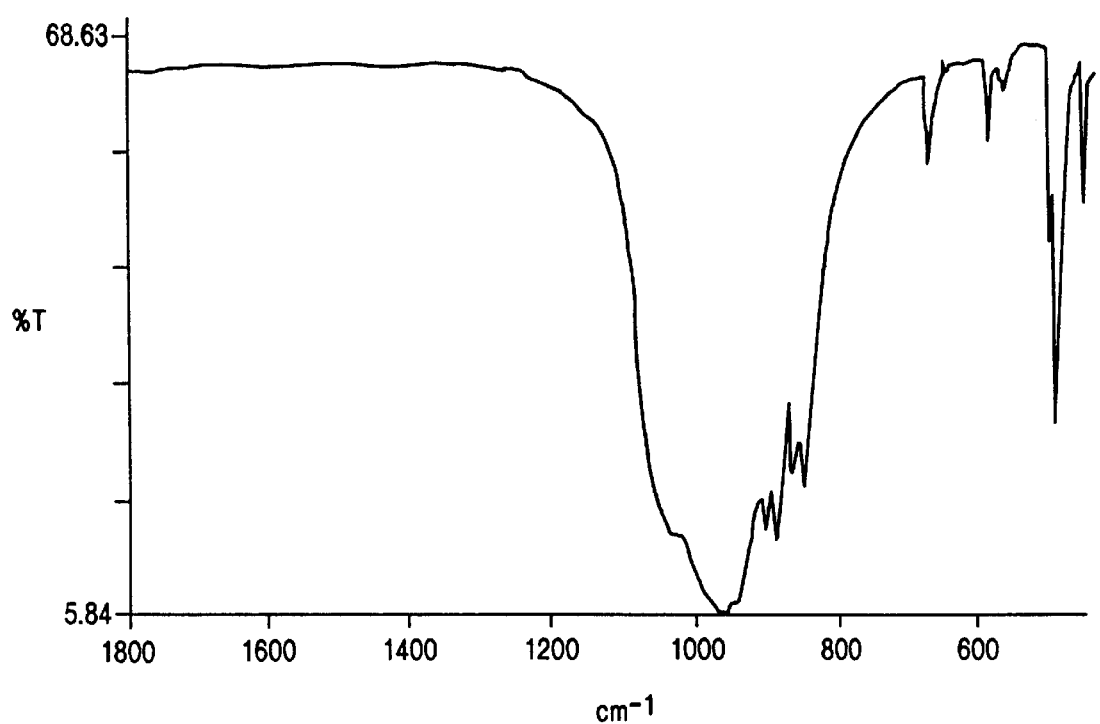

FIGS. 2, 3 and 4 show infrared spectra obtained for crystalline silicon nitride powders having, respectively, the α-Si$_3$N$_4$ crystal form in FIG. 2, the β-Si$_3$N$_4$ crystal form in FIG. 3 and a mixture of the two crystal forms in FIG. 4. In these various cases, many lines may be seen, the main absorption bands of which, at 950 and 495 cm$^{-1}$, being respectively due to the antisymmetric and symmetric stretching mode of the Si—N—Si groups.

Figure 5:
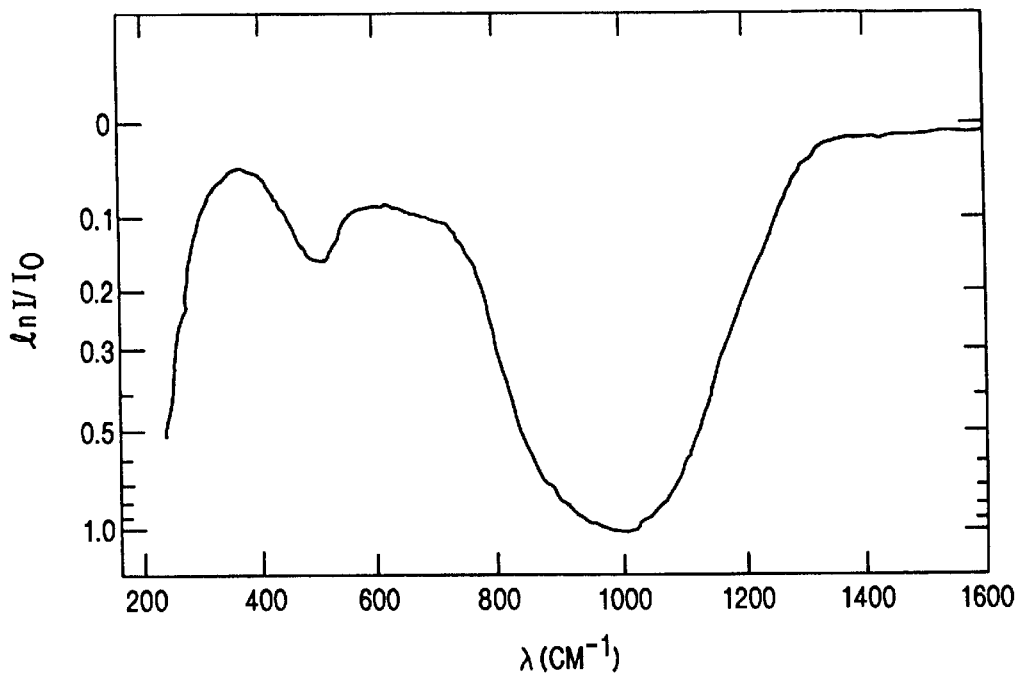

By way of comparison, the spectrum of an amorphous silicon nitride powder is also shown, in FIG. 5.

FIGS. 2, 3 and 5 were taken from the work of N. Wada et al., (N. Wada, S. A. Solin, J. Wong and S. Prochazka, J. Non-Crystalline Solids 43, p. 7 (1981)), while FIG. 4 was produced by the Inventors at the Laboratoire Lefemo-Lille.

Figure 6:
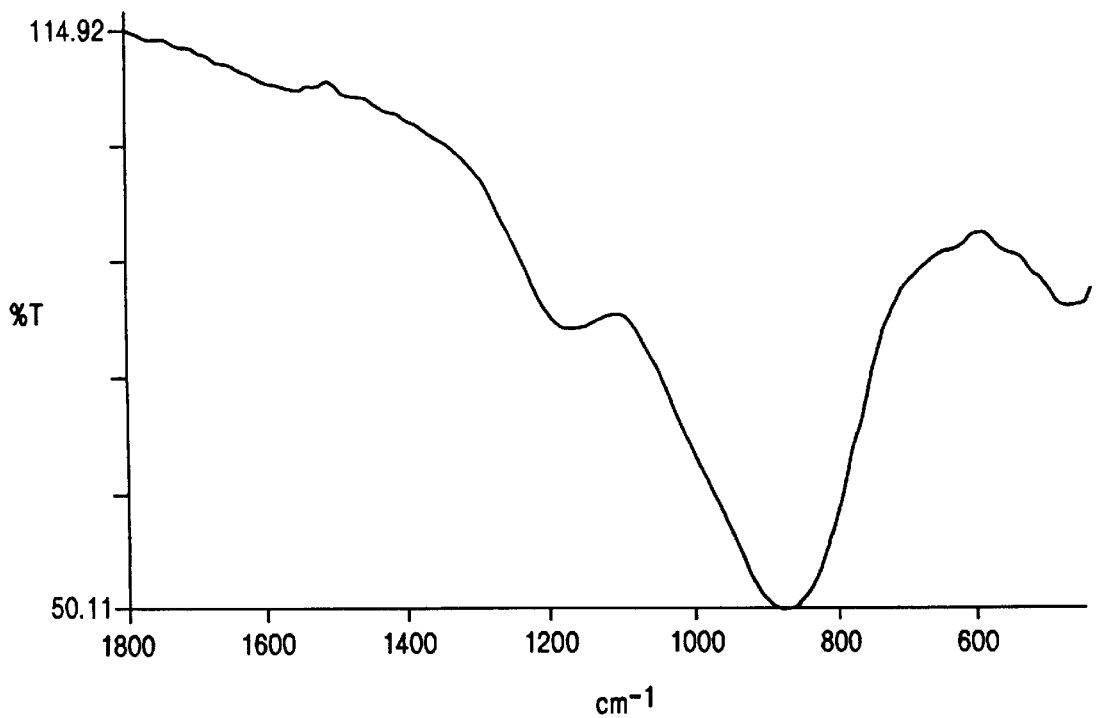
FIG. 6 shows an infrared spectrum for a protective layer based on silicon nitride obtained according to the process of the present invention.

In the case of a protective layer in the form of amorphous silicon nitride, obtained by carrying out the process according to the present invention, FIG. 6 shows that the fine structures characteristic of medium-range order which are observed in the α and β crystalline phases disappear, and give wider bands. This is due to the increase in the overall disorder in the amorphous lattice. In particular, an intense unsymmetrical band centered around the 870 cm$^{-1}$ peak may be seen in this spectrum.

Figure 7:
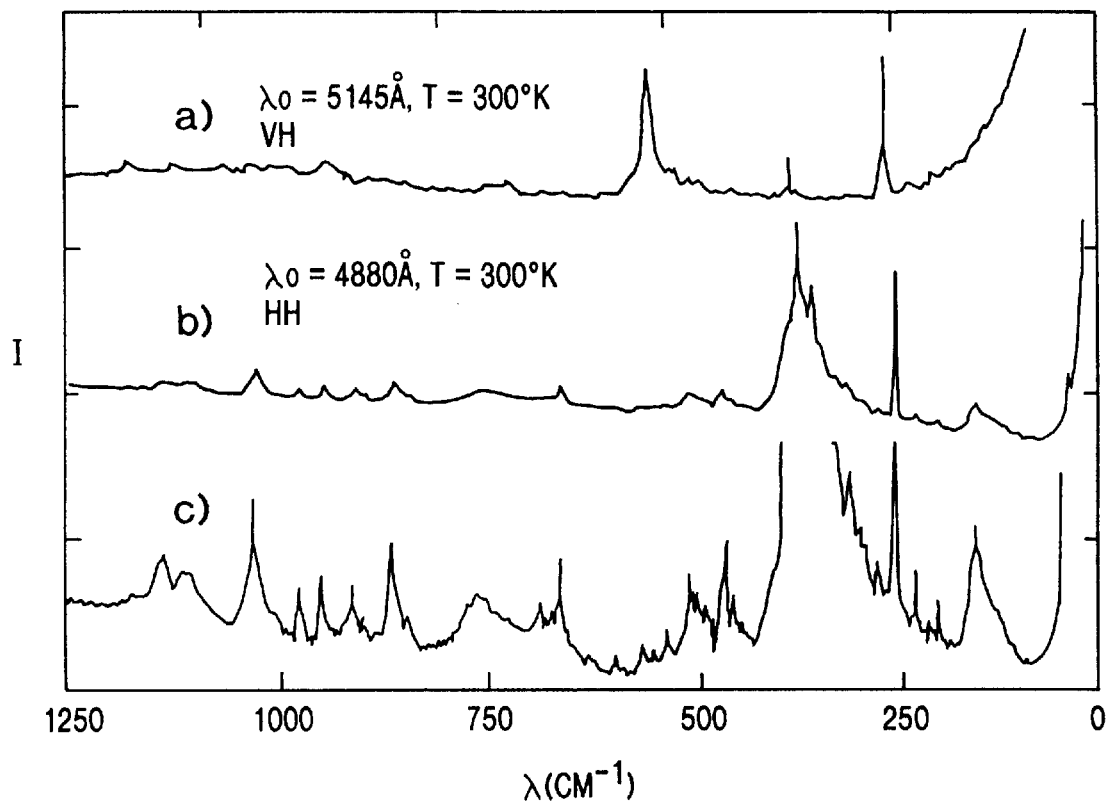
FIGS. 7, 8 and 9 show Raman spectra for various varieties of silicon nitride.
Figure 8:
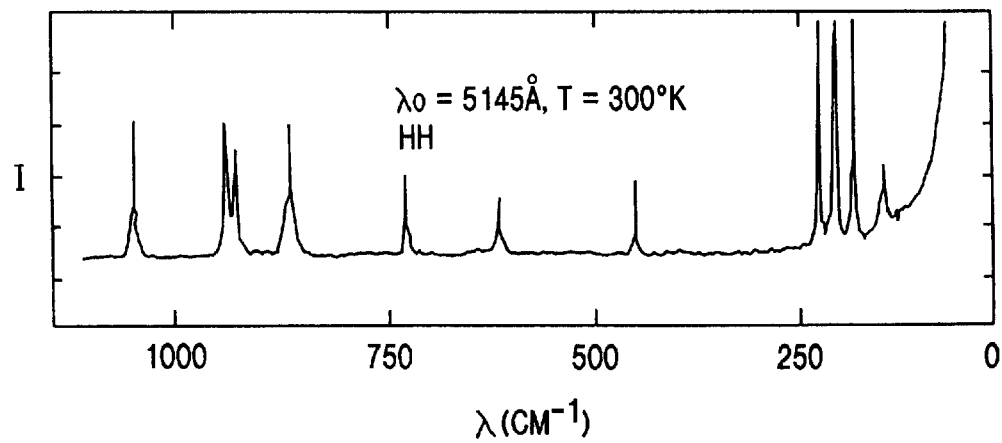
Figure 9:
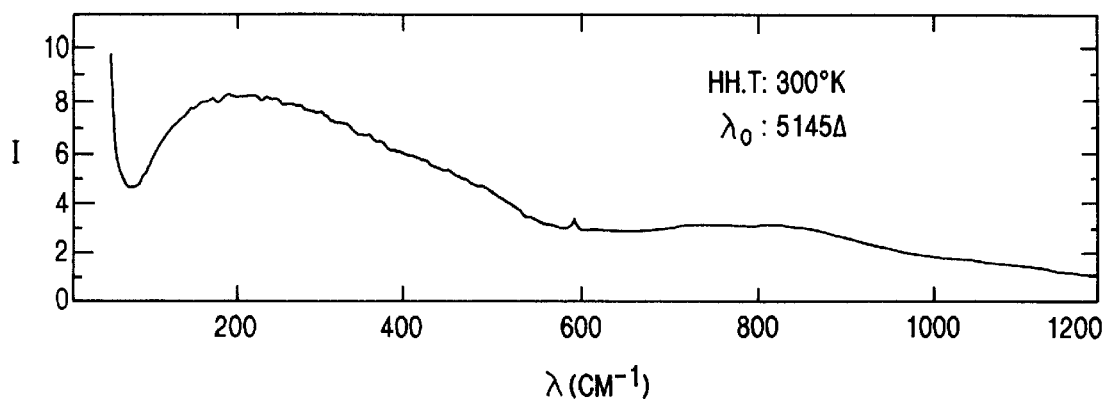

The same observations may be made on the Raman spectra shown in FIGS. 7 to 10. In the case of a crystalline silicon nitride having the α or β form, as shown in FIGS. 7 and 8, many lines may be seen. Again, by way of comparison, a Raman spectrum from an amorphous silicon nitride powder has been shown in FIG. 9. These figures were also taken from the work of N. Wada et al.

Figure 10:
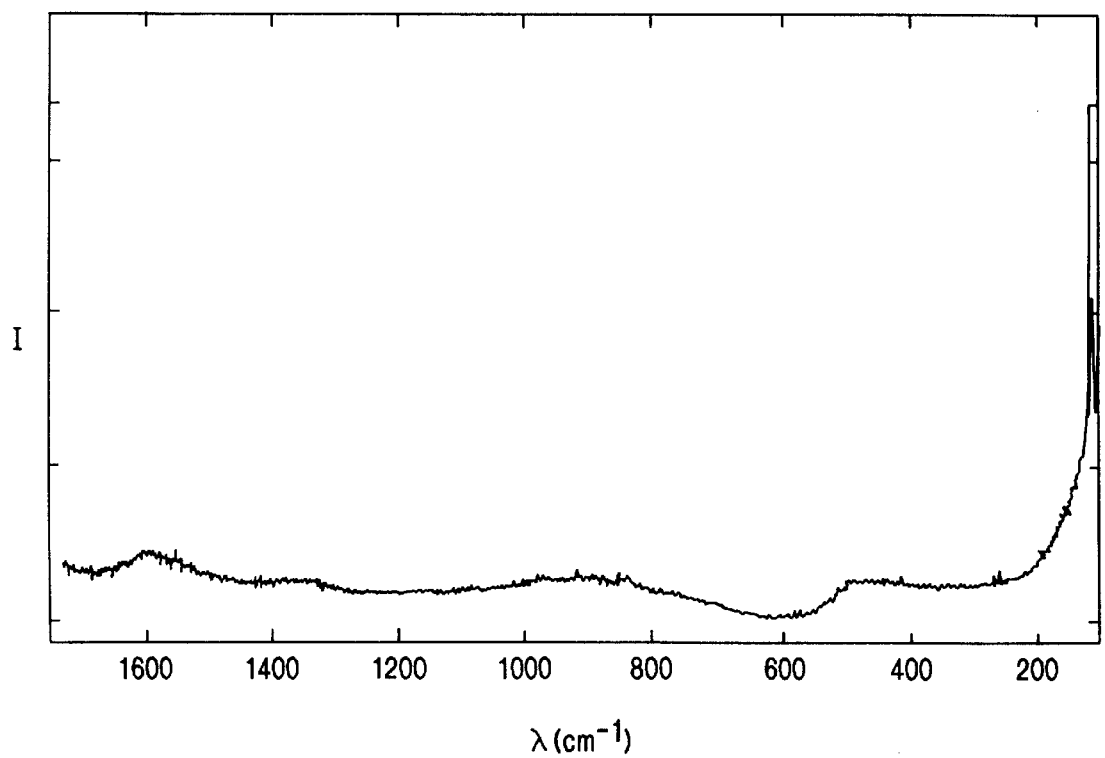
FIG. 10 shows a Raman spectrum for a protective layer based on silicon nitride obtained according to the present invention.

In the case of an amorphous protective layer obtained by applying the process according to the present invention and shown more particularly in FIG. 10, a more continuous shape of the spectrum, due to a lack of order in the lattice, is observed.

EXAMPLES

Example 1 a. Experimental Protocol

A sample of floor covering consisting of a PVC substrate is placed in a reaction chamber at approximately 15 mm from the injector. After creating an initial vacuum of 1.8× 10$^{-2}$ hPa, the plasmagenic nitrogen is introduced at a flow rate of 2.20 Nl/min and a pressure of 6.2 hPa.

The NRCP is created by a 2450 MHz microwave discharge with a power of 400 W.

After 5 minutes of pretreatment, the nitrogen pressure is brought to 1.3 hPa and the silicon precursor (silane diluted to 5% in nitrogen) is injected into the NRCP at a flow rate of 15 Ncm$^3$/min. The duration of precursor injection depends on the desired thickness of the material deposited. Examples are given in Table 3.

After the deposition phase, a nitrogen-based remote cold plasma is also created for 3 minutes at a pressure of 1.3 hPa.

b. Properties of the Deposited Film

Chemical: The deposited film mainly consists of hydrogenated silicon nitride, of which the main bands of the IR absorption spectrum, analyzed by transmission, of the material deposited on silicon are:

SiN (around 870 cm$^{-1}$)

Si—NH (3350; 1170 cm$^{-1}$)

Physical: The film obtained is transparent, hard, elastic, adherent and abrasion-resistant.

The static punch indentation test shows that there is good adhesion of the film (no disbondment between the deposited film and the floor covering) despite a deformation of 70 μm for a film having an average thickness of 4 μm.

Figure 11:
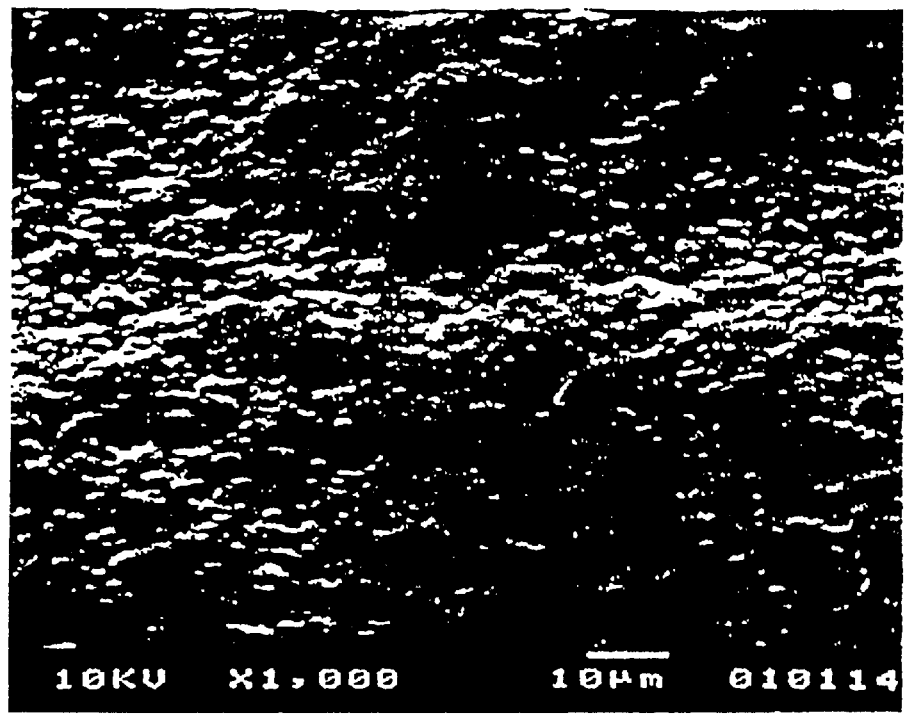
FIGS. 11 and 12 show photographs of the protective layer consisting of silicon nitride deposited on a PVC substrate before and after having been subjected to the Taber test.
Figure 12:
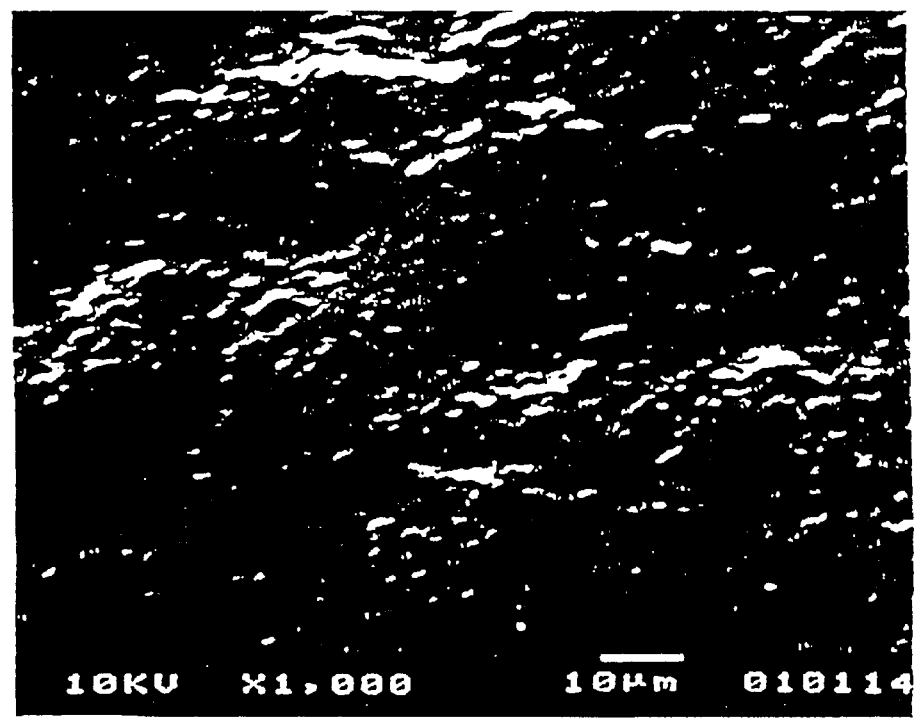
Figure 13:
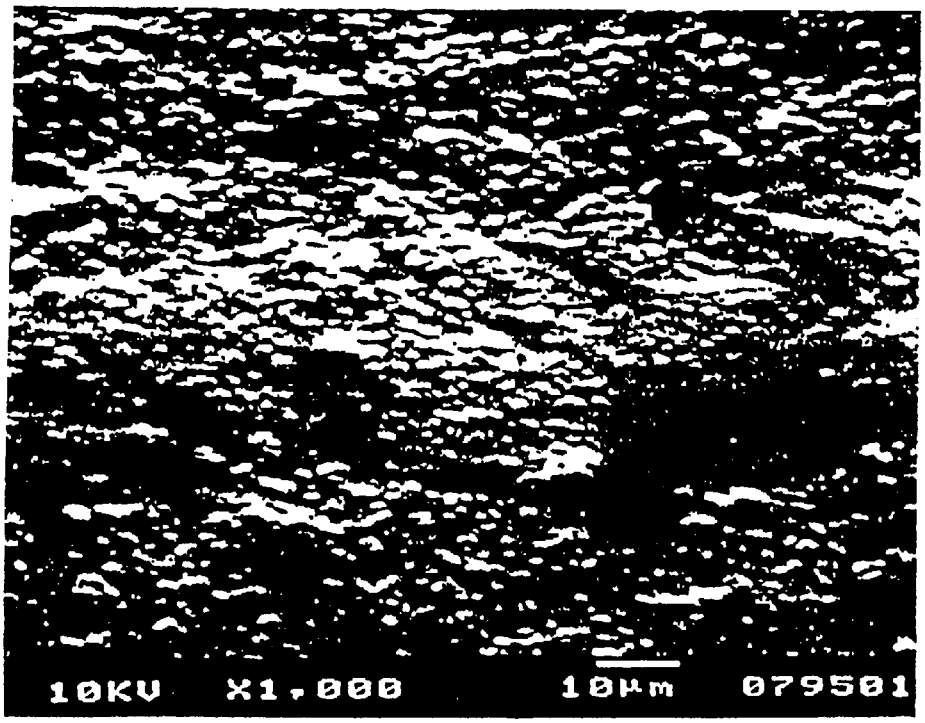
FIGS. 13 and 14 show photographs of a PVC substrate which is not coated with a protective layer, before and after having been subjected to the Taber test.
Figure 14:
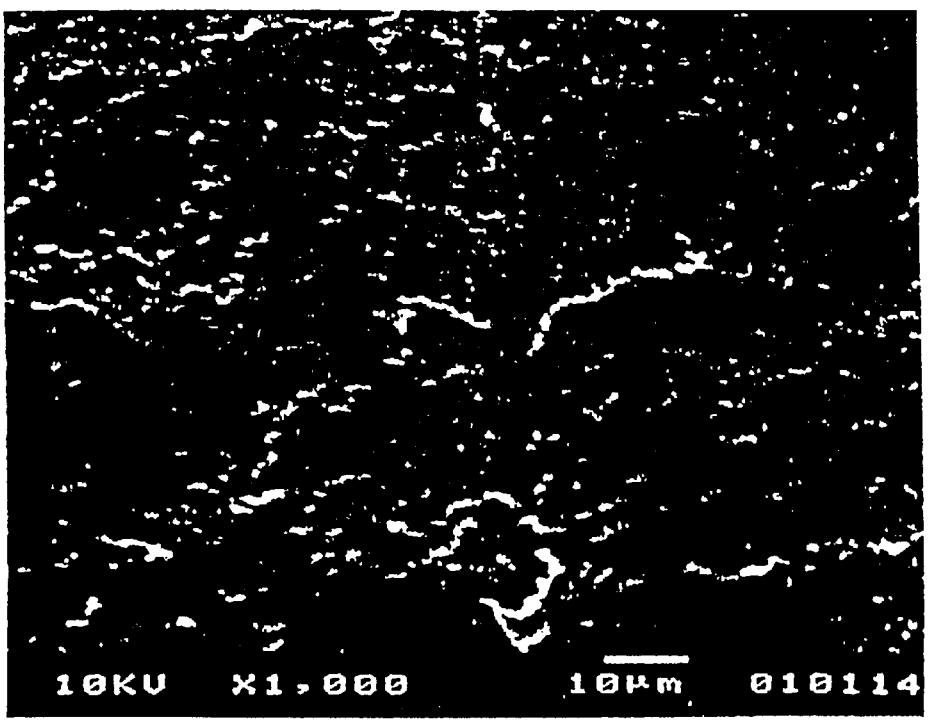

The abrasion resistance was measured using the Taber test. It should be noted that after 2000 Taber cycles (ASTM D-1044) using the CS-10F grinding wheels for a load of 500 g, the protective layer having a thickness of approximately 4 μm suffered no surface modification and no disbondment from the PVC substrate (see FIGS. 11 and 12). This same abrasion test was carried out on a PVC substrate not coated with a protective layer and, in this case, the substrate has already become damaged after 100 revolutions and has completely deteriorated after 2000 revolutions (see FIGS. 13 and 14).

Figure 15:
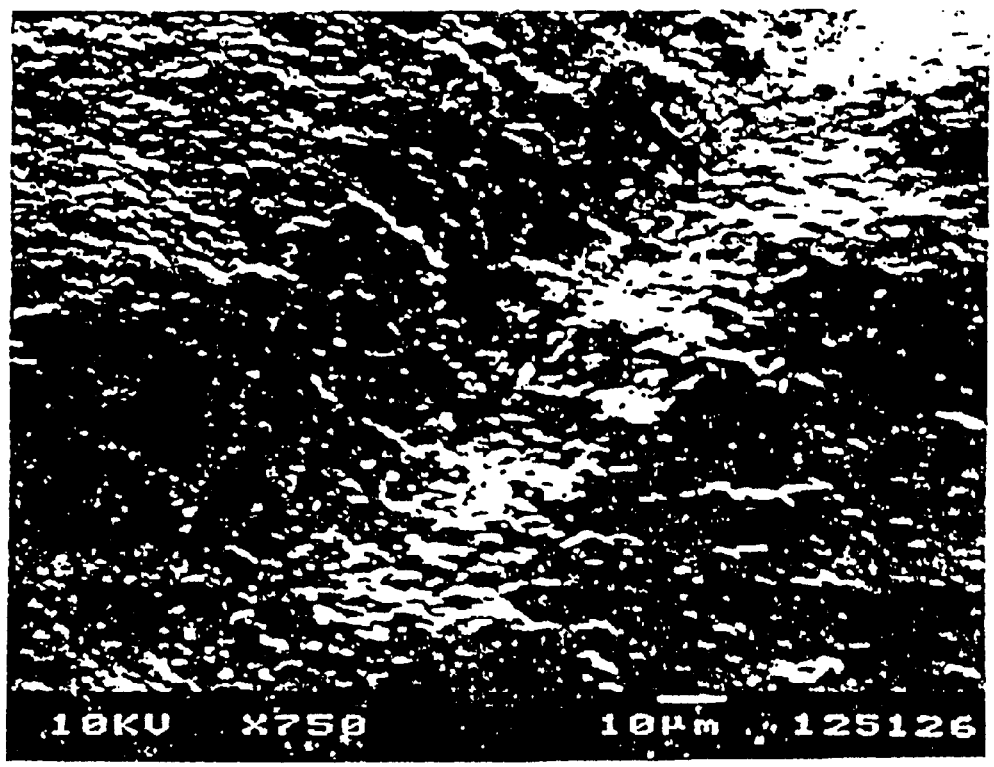
FIG. 15 shows a photograph of the protective layer deposited on a PVC substrate after having been subjected to the scratch test.

The elastic character of the protective layer may be measured by carrying out a scratch test using a Berkovitch indenter having a prescribed depth of 15 μm, which makes a scratch 2 mm in length. In this case, the protective layer having a thickness of approximately 4 μm again suffered no surface modification and no disbandment from the PVC substrate, although the latter does remain deformed (see also FIG. 15). This is because the depth of the scratch (after the test) is still 7 μm.

The hardness was measured using the Vickers method and has a value of 9 GPa, while the Young's modulus measured using the microindentation method has a value of 34 GPa for a protective layer of approximately 4 μm.

Example 2 a. Experimental Protocol

The specimen is the same as that used in Example 1 and the specimen-injector distance remains unchanged. The pretreatment remains the same.

Next, the nitrogen flow rate is taken back to 0.14 Nl/min and helium is introduced into the discharge region at a flow rate of 426 Ncm$^3$/min, followed by silane at a flow rate of 15 Ncm$^3$/min. The working pressure is 2 hPa.

After the deposition phase, an NRCP is created for 3 minutes at a pressure of 1.3 hPa.

b. Properties of the Deposited Film

The properties detected using IR spectroscopy are unchanged. The rate of deposition is slower. The film has a more pronounced shiny character. No mechanical assessment could be made on this type of film, given its small thickness.

Example 3 a. Experimental Protocol

The specimen is the same as that used in Examples 1 and 2, but, in this case, a tube for bringing the nitrogen-based remote cold plasma directly into the reactor above the specimen was added to the device.

The other experimental data remain the same.

b. Properties of the Deposited Film

Although the rate of deposition of the protective layer is markedly higher, the observed properties are not greatly dissimilar from those described in Example 1.

TABLE 1

| Compounds which can be used for producing the protective layer | Formula | Vickers microhardness in GPa | Modulus of elasticity in GPa |
|---|---|---|---|
| Silicon oxide | $SiO_2$ | 5–8 | — |
| Silicon nitride | $Si_3N_4$ | 8–17 | 250–330 |
| Titanium nitride | TiN | 21 | 600 |
| Silicon carbide | SiC | 26 | — |
| Titanium carbide | TiC | 28 | — |
| Boron carbide | $B_4C$ | 30 | — |
| Cubic boron nitride | c-BN | 45 | — |
| Carbon nitride | $C_3N_4$ | > | 900 |

TABLE 2

| Compounds given by way of comparison | Vickers microhardness in GPa | Modulus of elasticity in GPa |
|---|---|---|
| PVC | 0.07 | 2 |
| Steel | 9 | 210 |

TABLE 3

| Example 1 | | | |
|---|---|---|---|
| Deposition time (h) | 1 | 2 | 3 |
| Film thickness (μm) | 1.5 | 6 | 10 |
| Example 2 | | | |
| Deposition time (h) | | | 1 |
| Film thickness (μm) | | | 0.3 |
| Example 3 | | | |
| Deposition time (h) | 0.5 | 1 | 1.5 |
| Film thickness (μm) | 2.5 | 4 | 6 |

What is claimed is:

1. A process for applying a protective layer substantially comprising one amorphous inorganic component to a floor covering comprising at least one resilient polymeric substrate, wherein said process comprises the steps of:
   placing said substrate in a chamber;
   forming a remote cold plasma;
   causing said plasma to flow into said chamber by creating a partial vacuum in said chamber; and
   injecting a volatile precursor compound of said inorganic component into said chamber,
   wherein said remote cold plasma induces a decomposition reaction of said volatile precursor compound resulting in the deposition of said protective layer on said polymeric substrate, said protective layer having a Vickers hardness of greater than 1 GPa and a modulus of elasticity of less than 80 GPa.

2. The process of claim 1, wherein said protective layer has a Vickers hardness of between 1 and 10 GPa and a modulus of elasticity of less than 50 GPa.

3. The process of claim 2, wherein said protective layer has a modulus of elasticity of between 20 and 50 GPa.

4. The process of claim 1, wherein said step of forming comprises causing a metered flow of molecular nitrogen to flow through a resonant cavity wherein said nitrogen is excited by electromagnetic energy having a frequency above 1000 MHz.

5. The process of claim 4, wherein said electromagnetic energy is microwave energy resonant in said cavity at a frequency of 2450 MHz.

6. The process of claim 4, wherein said electromagnetic energy is microwave energy resonant in said cavity at a frequency of 13.56 MHz.

7. The process of claim 4, wherein said nitrogen, upon being excited by said electromagnetic energy, forms a discharge plasma having a high concentration of nitrogen ions and as said discharge plasma flows away from said resonant cavity said discharge plasma becomes said remote cold plasma characterized by non-ionic active species of nitrogen corresponding to a far afterglow region, so that said chamber is filled with an atmosphere of remote cold plasma in the far afterglow region substantially free of nitrogen ions.

8. The process of claim 1, wherein said volatile precursor compound is selected from the group consisting of $SiH_4$, $SiCl_4$, $SiF_4$, $SiH_2Cl_2$, $Si_2H_6$, $Si_3H_8$, $CH_3$—$CH_2$—$SiH_2Cl$, $CH_3$—$CH_2$—$SiHCl_2$, $N[(CH_3)_2]_3SiH$ and $N[(CH_3)_2]_4Si$.

9. The process of claim 7, wherein said volatile precursor compound is introduced into said chamber colinearly with the remote cold plasma.

10. The process of claim 4, wherein said step of causing comprises pretreating said substrate by exposing said substrate to said remote cold plasma for a period of time before said step of injecting, whereby the surface energy of said substrate is increased to improve adhesion of said protective layer.

11. The process of claim 7, wherein said step of causing comprises pretreating said substrate by exposing said substrate to said remote cold plasma for a period of time before said step of injecting, whereby the surface energy of said substrate is increased to improve adhesion of said protective layer.

12. The process of claim 16, further comprising the steps of:
   stopping the injection of said volatile precursor compound into said chamber; and
   continuing the flow of said remote cold plasma into said chamber to displace substantially all traces of said volatile precursor compound from said chamber.

13. The process of claim 7, further comprising the steps of:
   stopping the injection of said volatile precursor compound into said chamber; and
   continuing the flow of said remote cold plasma into said chamber to displace substantially all traces of said volatile precursor compound from said chamber.

14. The process of claim 16, wherein said chamber has a working pressure of between 1 and 20 hPa and said process occurs at temperatures not exceeding 325° K.

15. A floor covering produced by the process of claim 1.

16. A floor covering produced by the process of claim 2.

17. A floor covering produced by the process of claim 3.

18. The floor covering of claim 15, wherein said protective layer has a thickness of less than 10 μm.

19. The floor covering of claim 18, wherein the thickness of said protective layer is between 1 and 5 μm.

20. The floor covering of claim 15, wherein said amorphous inorganic component comprises silicon nitride.

21. The floor covering of claim 16, wherein said at least one resilient polymeric substrate is selected from the group consisting of PVC, acrylic resin, olefin homopolymers and olefin copolymers.

* * * * *